(12) United States Patent  
Vellianitis et al.

(10) Patent No.: US 9,219,131 B2  
(45) Date of Patent: Dec. 22, 2015

(54) MOSFETS WITH CHANNELS ON NOTHING AND METHODS FOR FORMING THE SAME

(71) Applicant: Taiwan Semiconductor Manufacturing Company, Ltd., Hsin-Chu (TW)

(72) Inventors: Georgios Vellianitis, Heverlee (BE); Mark van Dal, Linden (BE); Blandine Duriez, Brussels (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/591,321

(22) Filed: Jan. 7, 2015

(65) Prior Publication Data

US 2015/0126001 A1 May 7, 2015

Related U.S. Application Data

(60) Continuation of application No. 14/289,735, filed on May 29, 2014, now Pat. No. 9,018,063, which is a division of application No. 13/436,322, filed on Mar. 30, 2012, now Pat. No. 8,779,554.

(51) Int. Cl.

| H01L 29/06 | (2006.01) |
|---|---|
| H01L 29/78 | (2006.01) |
| H01L 29/66 | (2006.01) |
| H01L 21/306 | (2006.01) |
| H01L 29/10 | (2006.01) |
| H01L 21/762 | (2006.01) |

(52) U.S. Cl.

CPC .... *H01L 29/66477* (2013.01); *H01L 21/30604* (2013.01); *H01L 21/76264* (2013.01); *H01L 29/0653* (2013.01); *H01L 29/1033* (2013.01); *H01L 29/66795* (2013.01); *H01L 29/7853* (2013.01)

(58) Field of Classification Search

CPC ... H01L 29/06; H01L 29/78; H01L 21/76232; H01L 21/28123; H01L 229/7848; H01L 21/823807; H01L 21/823878; H01L 29/665; H01L 29/66628; H01L 29/66636; H01L 21/823814; H01L 27/1207; H01L 29/0653

See application file for complete search history.

(56) References Cited

U.S. PATENT DOCUMENTS

| 2004/0235262 A1 | 11/2004 | Lee et al. |
|---|---|---|
| 2005/0020085 A1 | 1/2005 | Lee et al. |
| 2006/0170011 A1 | 8/2006 | Irisawa et al. |
| 2006/0208342 A1 | 9/2006 | Choi et al. |

(Continued)

FOREIGN PATENT DOCUMENTS

JP 2005228781 8/2005

*Primary Examiner* — David Vu  
*Assistant Examiner* — Mouloucoulaye Inoussa  
(74) *Attorney, Agent, or Firm* — Slater & Matsil, L.L.P.

(57) ABSTRACT

A method includes performing an epitaxy to grow a semiconductor layer, which includes a top portion over a semiconductor region. The semiconductor region is between two insulation regions that are in a substrate. The method further includes recessing the insulation regions to expose portions of sidewalls of the semiconductor region, and etching a portion of the semiconductor region, wherein the etched portion of the semiconductor region is under and contacting a bottom surface of the semiconductor layer, wherein the semiconductor layer is spaced apart from an underlying region by an air gap. A gate dielectric and a gate electrode are formed over the semiconductor layer.

20 Claims, 19 Drawing Sheets

(56) References Cited

U.S. PATENT DOCUMENTS

| | | |
|---|---|---|
| 2009/0315074 A1 | 12/2009 | Wang et al. |
| 2010/0013015 A1 | 1/2010 | Snyder |
| 2010/0258870 A1* | 10/2010 | Hsu et al. ................ 257/347 |
| 2011/0147839 A1* | 6/2011 | Yagishita et al. ......... 257/347 |
| 2012/0025313 A1* | 2/2012 | Chang et al. ............. 257/347 |

* cited by examiner

MOSFETS WITH CHANNELS ON NOTHING AND METHODS FOR FORMING THE SAME

This application is a continuation of U.S. application Ser. No. 14/289,735 entitled "MOSFETs with Channels on Nothing and Methods for Forming the Same," filed May 29, 2014 which is a divisional of U.S. patent application Ser. No. 13/436,322, entitled "MOSFETs with Channels on Nothing and Methods for Forming the Same," filed on Mar. 30, 2012, which applications are incorporated herein by reference.

BACKGROUND

With the increasing down-scaling of integrated circuits, Metal-Oxide-Semiconductor Field-Effect Transistors (MOSFETs) became increasingly smaller, with increasingly shorter gates. This requires the junctions, particularly the junctions between lightly doped source/drain regions and pocket regions, to be shallower. However, due to the diffusion of the implanted impurities, it is very difficult to reduce the depth of the junction to about 50 Å for Short Channel Effect (SCE) control.

What makes the reduction of the junction depths more difficult is that for smaller MOSFETs, the pocket regions need to have higher impurity concentrations. However, with heavier pocket implantations, several adverse effects may be resulted. For example, although the SCE control and the Drain-Induced Barrier Lowering (DIBL) may be better, the carrier mobility of the carriers in the channel region is degraded, resulting in smaller device drive currents. To solve these problems, Silicon-On-Nothing (SON) MOSFETs have been proposed. SON MOSFETs have air-gaps under channel regions. With the air-gaps, the SCE of the SON MOSFETs is improved, and leakage currents can be reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Metal-Oxide-Semiconductor Field Effect Transistor (MOSFET) with a channel on nothing and the methods of forming the same are provided in accordance with various exemplary embodiments. The intermediate stages of forming the MOSFET are illustrated. The variations of the embodiments are discussed. Throughout the various views and illustrative embodiments, like reference numbers are used to designate like elements.

Figure 1:
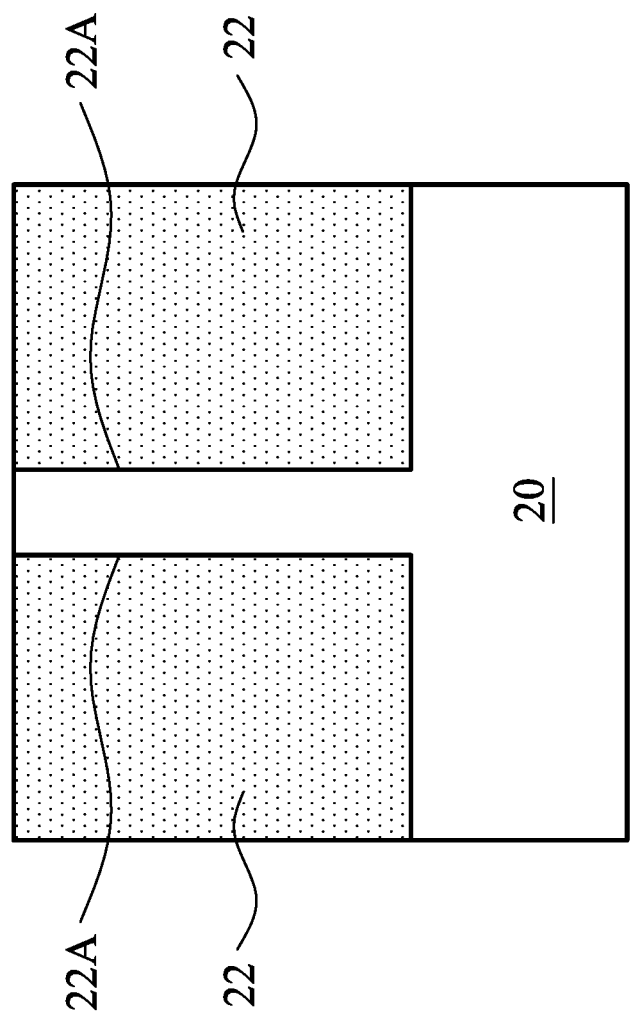
FIGS. 1 through 8B are cross-sectional views, top views, and perspective views of intermediate stages in the manufacturing of a Metal-Oxide-Semiconductor Field Effect Transistor (MOSFET) in accordance with some exemplary embodiments, wherein the MOSFET has a channel on nothing.

Referring to FIG. 1, substrate 20, which may be a portion of a semiconductor wafer, is provided. Substrate 20 may be a semiconductor substrate. Substrate 20 may be a bulk substrate, or may have a silicon-on-insulator structure. In some embodiments, substrate 20 is a silicon substrate, although it may also comprise silicon germanium (SiGe), silicon carbon (SiC), or the like. Insulation regions such as Shallow Trench Isolation (STI) regions 22 are formed in a top portion of substrate 20. STI regions 22 may be formed by recessing semiconductor substrate 20 to form openings, and then filling the openings with dielectric materials. STI regions 22 may include two neighboring regions having their sidewalls 22A facing each other, with a portion of substrate 20 between, and adjoining, the two neighboring STI regions 22.

Figure 2:
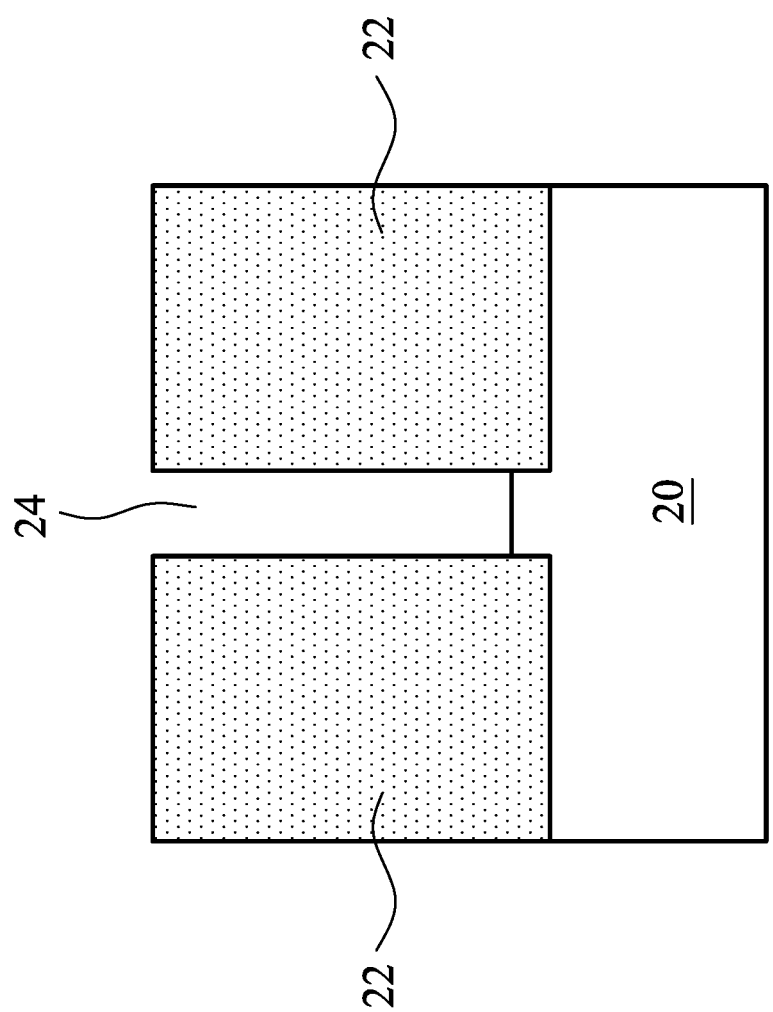

Referring to FIG. 2, the portion of substrate 20 that is between two neighboring STI regions 22 is removed, forming opening 24. In some embodiments, the bottom of opening 24 is level with the bottoms of STI regions 22. In alternative embodiments, the bottom of opening 24 may be lower than or higher than the bottoms of STI regions 22.

Referring again to FIG. 3A, epitaxy region 26 is formed in opening 24, for example, using Selective Epitaxial Growth (SEG). Epitaxy region 26 may be formed of a semiconductor material, which may comprise a group IV material such as Si, Ge, C, or combinations thereof. In some exemplary embodiments, epitaxy region 26 is formed of substantially pure germanium, for example, with a germanium percentage greater than about 95 percent. In alternative embodiments, epitaxy region 26 comprises SiGe, which may be expressed as $Si_{1-z}Ge_z$, wherein z is the atomic percentage of germanium in the silicon germanium, and z may be greater than 0, and may be equal to or less than 1. When z is equal to about 1, SiGe layer 26 is formed of substantially pure germanium. In some exemplary embodiments, z is between about 0.1 and about 1. In yet other embodiments, epitaxy region 26 comprises a III-V compound semiconductor material comprising, but is not limited to, GaAs, InP, GaN, InGaAs, InAlAs, GaSb, AlSb, AlAs, AlP, GaP, combinations thereof, and multi-layers thereof. Epitaxy region 26 may also be formed of a II-VI compound material. The top surface of epitaxy region 26 may be level with, higher than, or lower than, the top surface of STI regions 22. In some embodiments, epitaxy region 26 is grown to a level higher than the top surfaces of STI regions 22. A planarization such as a Chemical Mechanical Polish (CMP) is performed to level the top surface of epitaxy region 26 with the top surfaces of STI regions 22.

Figure 3A:
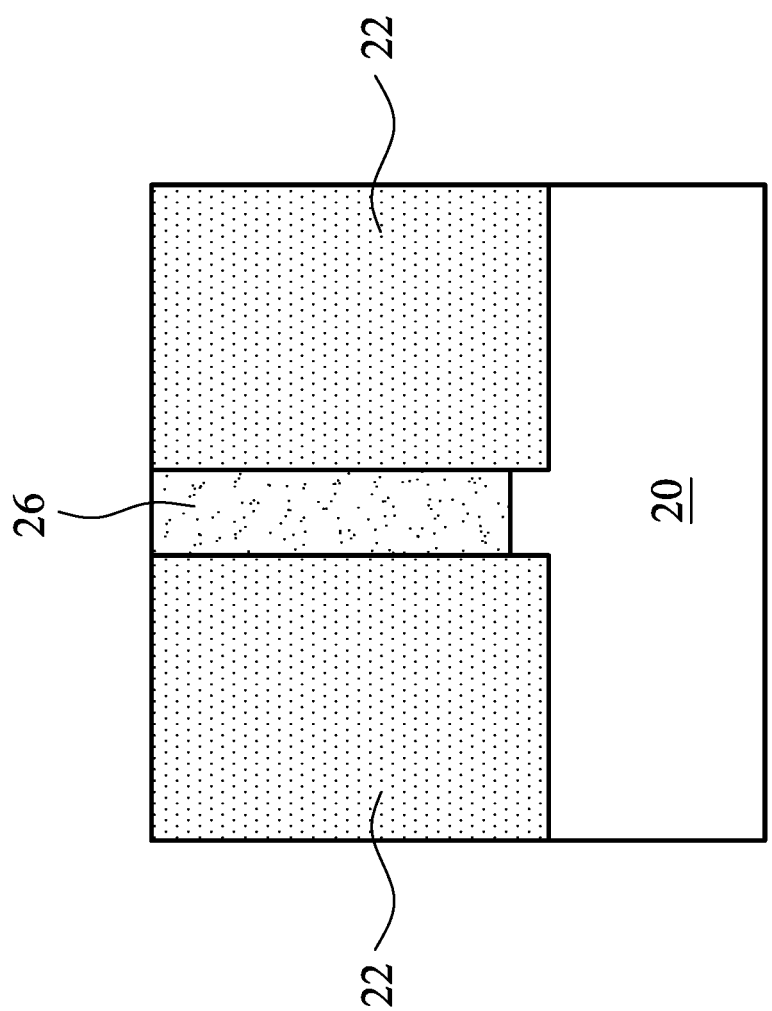
Figure 3B:
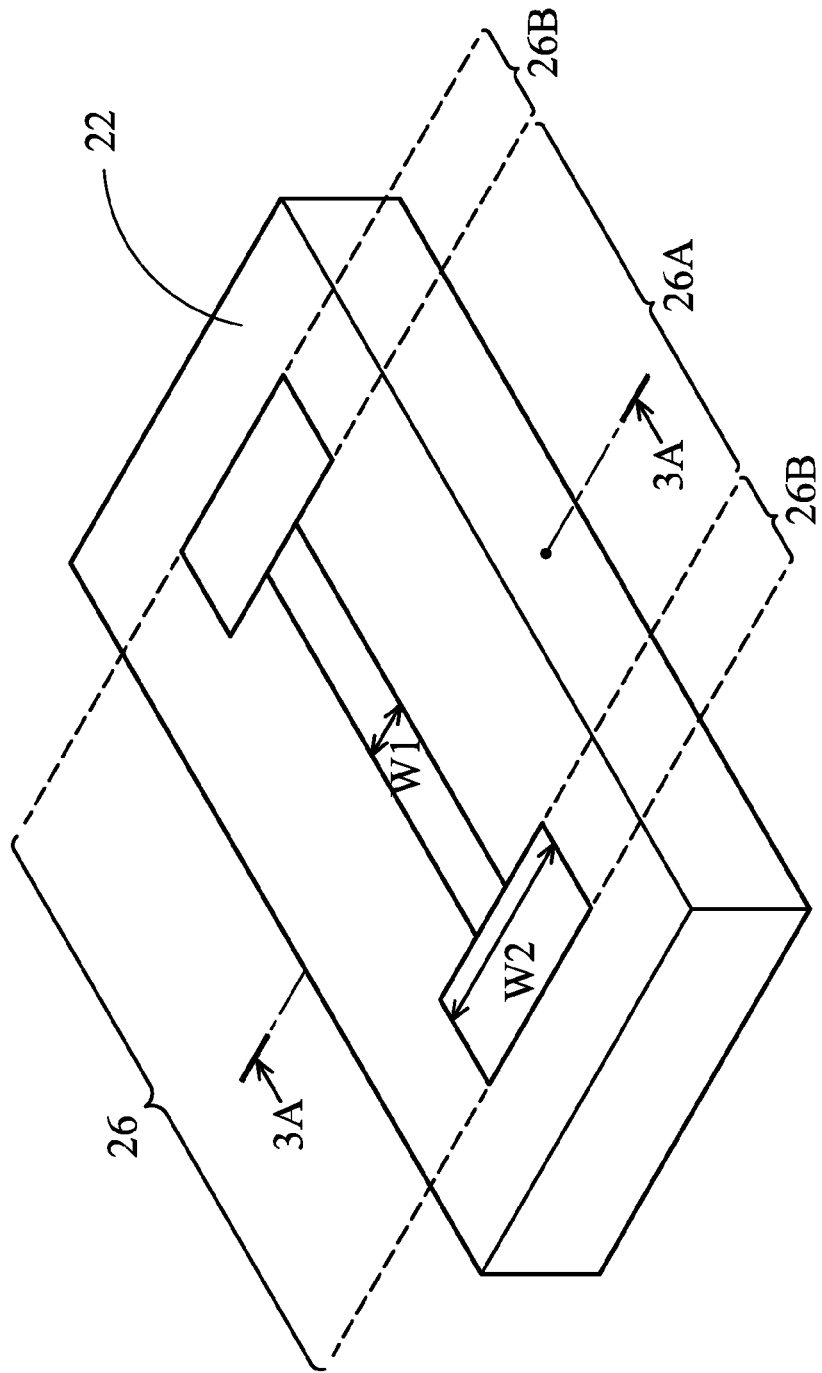

FIG. 3B illustrates a perspective view of the structure shown in FIG. 3A, wherein the cross-sectional view in FIG. 3A is obtained from the plane crossing line 3A-3A in FIG. 3B. In some embodiments, epitaxy region 26 has a dog-bone shape including narrow portion 26A, and wide portions 26B connected to the opposite ends of narrow portion 26A. Width W1 of narrow portion 26A may be between about 5 nm and about 20 nm. Width W2 of wide portions 26B may be greater than about 20 nm, or greater than about 40 nm. One of ordinary skill in the art will realize, however, that the dimensions recited throughout the description are merely examples, and may be changed to different values. Although wide portions 26B are illustrated as having a rectangular shape, they may also have other shapes. For example, wide portions 26B may have trapezoid shapes, with the narrow sides of the trapezoids connected to narrow portion 26A.

Figure 4:
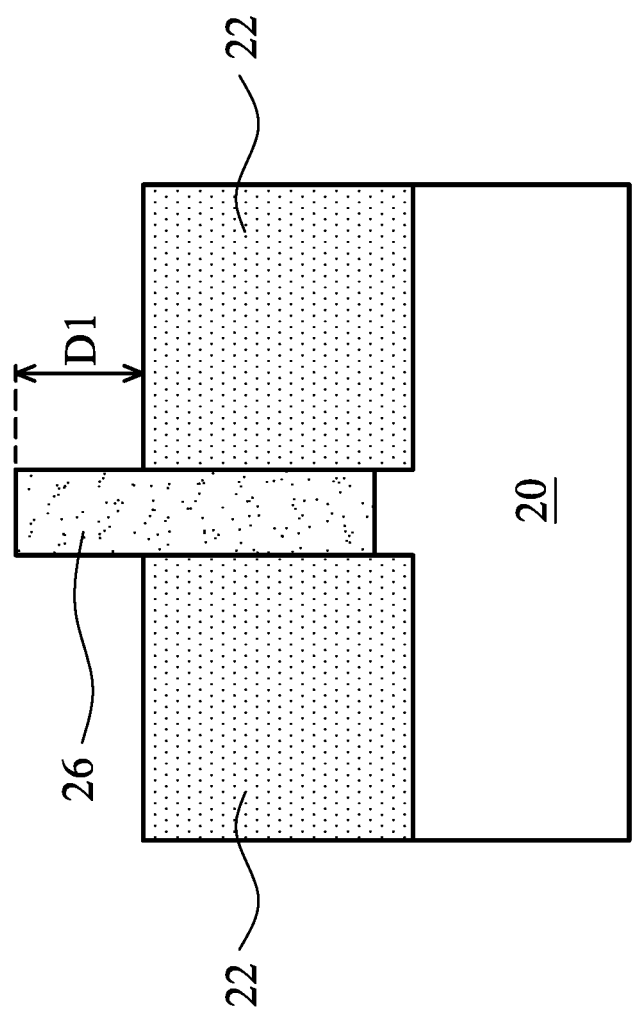
Figure 5:
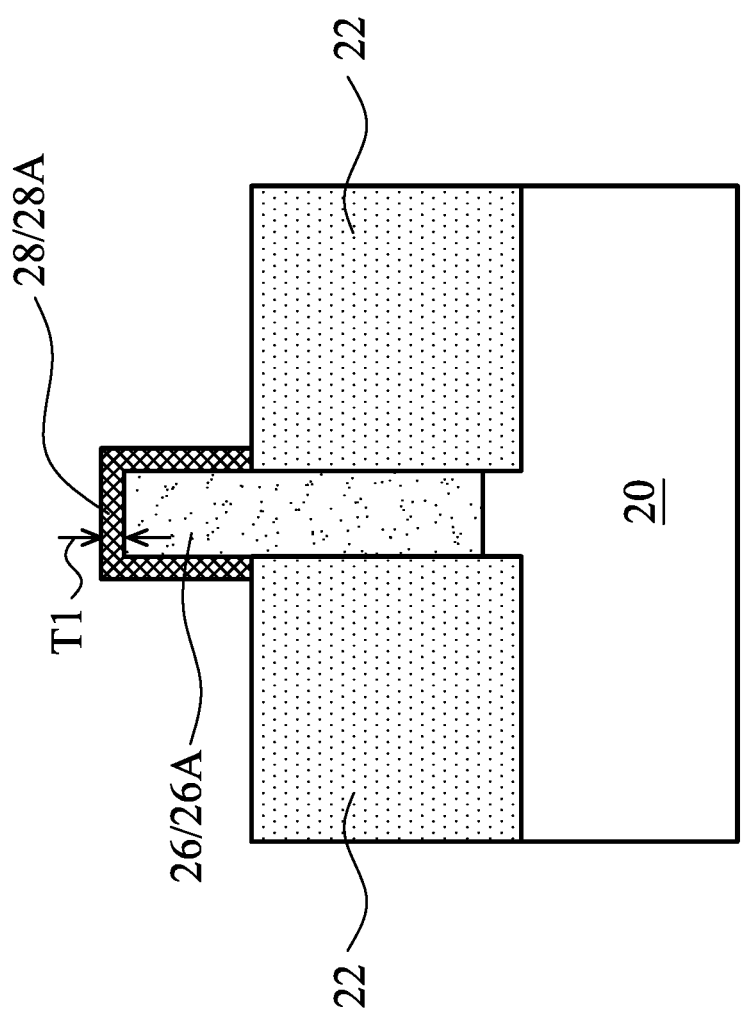

Referring to FIG. 4, STI regions 22 are recessed. The recessing depth D1 may be greater than about 5 nm, for example. Accordingly, a portion of epitaxy region 26 protrudes above the top surfaces of the adjacent STI regions 22. Next, as shown in FIG. 5, epitaxy semiconductor layer 28 is grown on the top surface and sidewalls of epitaxy region 26. Epitaxy semiconductor layer 28 may be a substantially conformal layer, and hence the sidewall portions and the top portion have substantially the same depth. The epitaxy is selective, so that epitaxy semiconductor layer 28 is not grown on STI regions 22. Thickness T1 of epitaxy semiconductor layer 28 may be smaller than about 40 nm, and may be between about 5 nm and about 40 nm, for example. Epitaxy semiconductor layer 28 includes narrow portion 28A formed on the top surface and sidewalls of narrow portion 26A of epitaxy region 26. Furthermore, epitaxy semiconductor layer 28 includes wide portions 28B (refer to FIG. 7B) formed on the top surfaces and sidewalls of wide portions 26B of epitaxy region 26.

In the embodiments illustrated in FIGS. 2 through 5, epitaxy region 26 is formed to replace the portion of substrate 20, which portion is between opposite sidewalls of STI regions 22. In alternative embodiments, the steps shown in FIGS. 2 through 3 are skipped. Instead, the STI recessing step is performed on the structure shown in FIG. 1, and the resulting structure is similar to what is shown in FIG. 5, except that the illustrated epitaxy region 26 is not epitaxially grown, and instead, is a portion of the original substrate 20, which may be a silicon substrate, for example.

Figure 6:
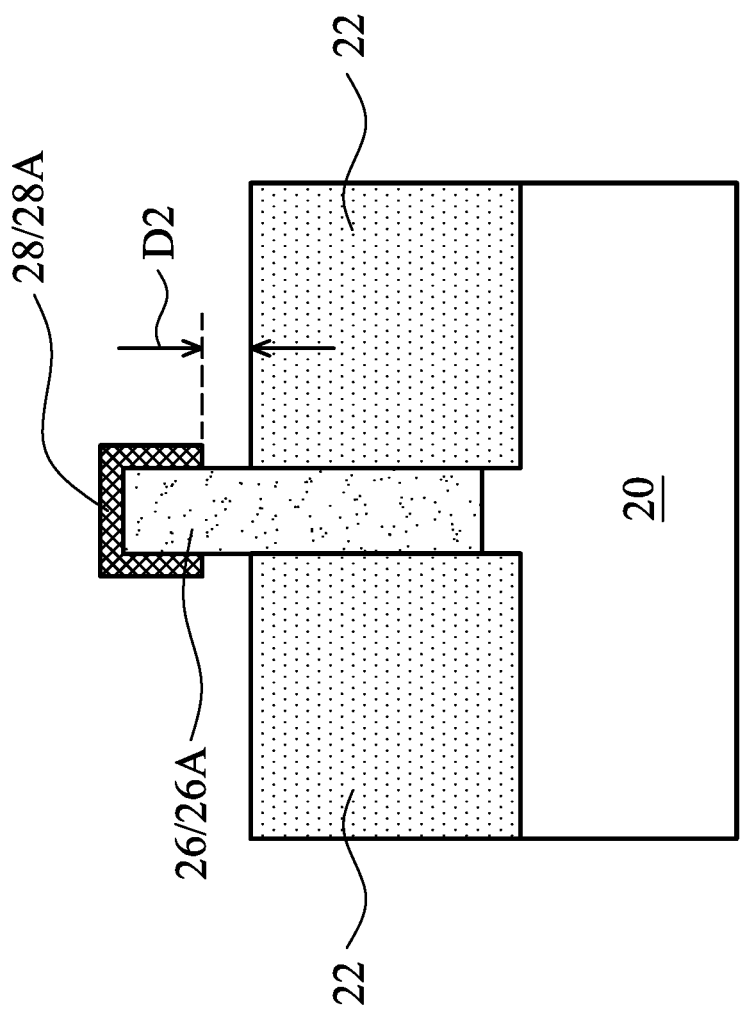

FIG. 6 illustrates the further recessing of STI regions 22, wherein recessing depth D2 may be between about 5 nm and about 40 nm. Portions of the sidewalls of epitaxy region 26 are thus exposed.

Figure 7A:
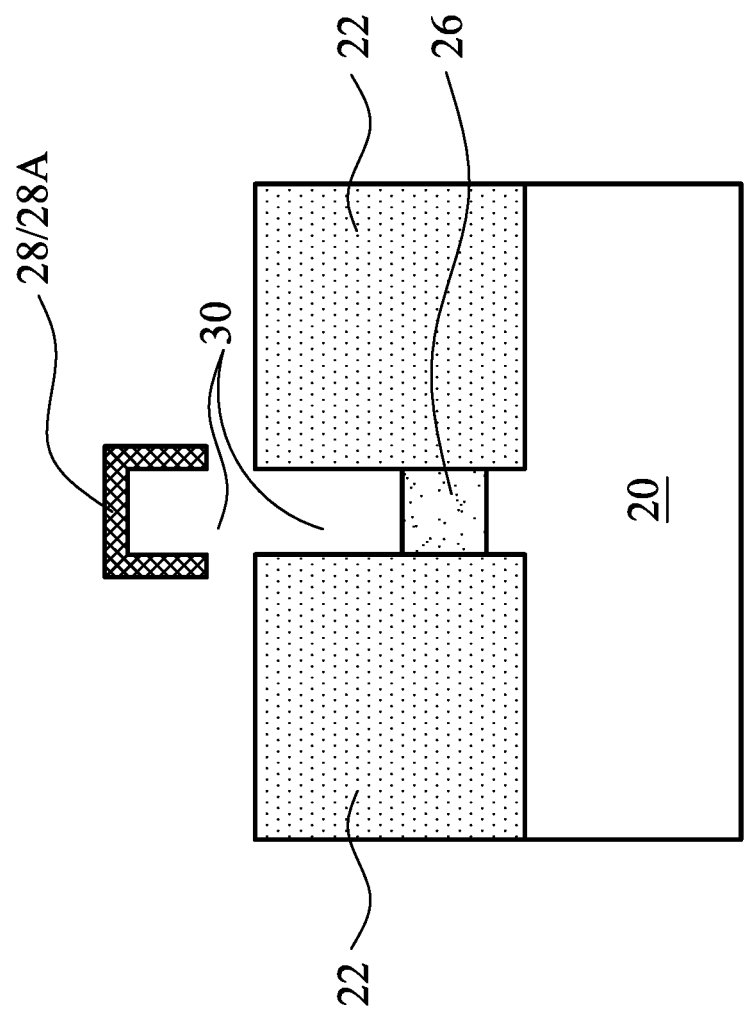

Next, as shown in FIG. 7A, an etching is performed to etch the exposed portion of epitaxy region 26. The etchant is selected to attack epitaxy region 26, while the etching to epitaxy semiconductor layer 28 and STI regions 22 is minimal, if any. Accordingly, the materials of epitaxy region 26 and epitaxy semiconductor layer 28 are also selected to have a high etching selectivity, and an appropriate etchant may be selected correspondingly. In some exemplary embodiments, epitaxy semiconductor layer 28 is formed of silicon, and epitaxy region 26 is a formed of germanium. The corresponding etchant may be hydrogen fluoride (HCl). In alternative exemplary embodiments, epitaxy semiconductor layer 28 is formed of $Si_{1-y}Ge_y$, and epitaxy region 26 is formed of $Si_{1-x}Ge_x$, with x>y. The corresponding etchant may also be HCl. In yet alternative exemplary embodiments, epitaxy semiconductor layer 28 comprises InGaAs, and epitaxy region 26 comprises InP. The corresponding etchant may be HCl. In yet alternative exemplary embodiments, epitaxy semiconductor layer 28 comprises InP, and epitaxy region 26 comprises InGaAs. The corresponding etchant may be a combination of $H_3PO_4$ and $H_2O_2$. In yet alternative exemplary embodiments, epitaxy semiconductor layer 28 comprises GaSb, and epitaxy region 26 comprises InAs. The corresponding etchant may be a combination of citric acid ($C_6H_8O_7$) and $H_2O_2$. In yet alternative exemplary embodiments, epitaxy semiconductor layer 28 comprises InAs, and epitaxy region 26 comprises GaSb. The corresponding etchant may be $NH_4OH$.

As shown in FIGS. 6 and 7A, after the etching, the narrow portion 26A has at least its top portion removed, and hence narrow portion 28A of epitaxy semiconductor layer 28 is separated from the underlying epitaxy region 26 (or substrate 20 if epitaxy region 26 is fully removed) by air gap 30. It is observed that air gap 30 includes a portion higher than the top surfaces of STI regions 22, and a portion between STI regions 22.

Figure 7B:
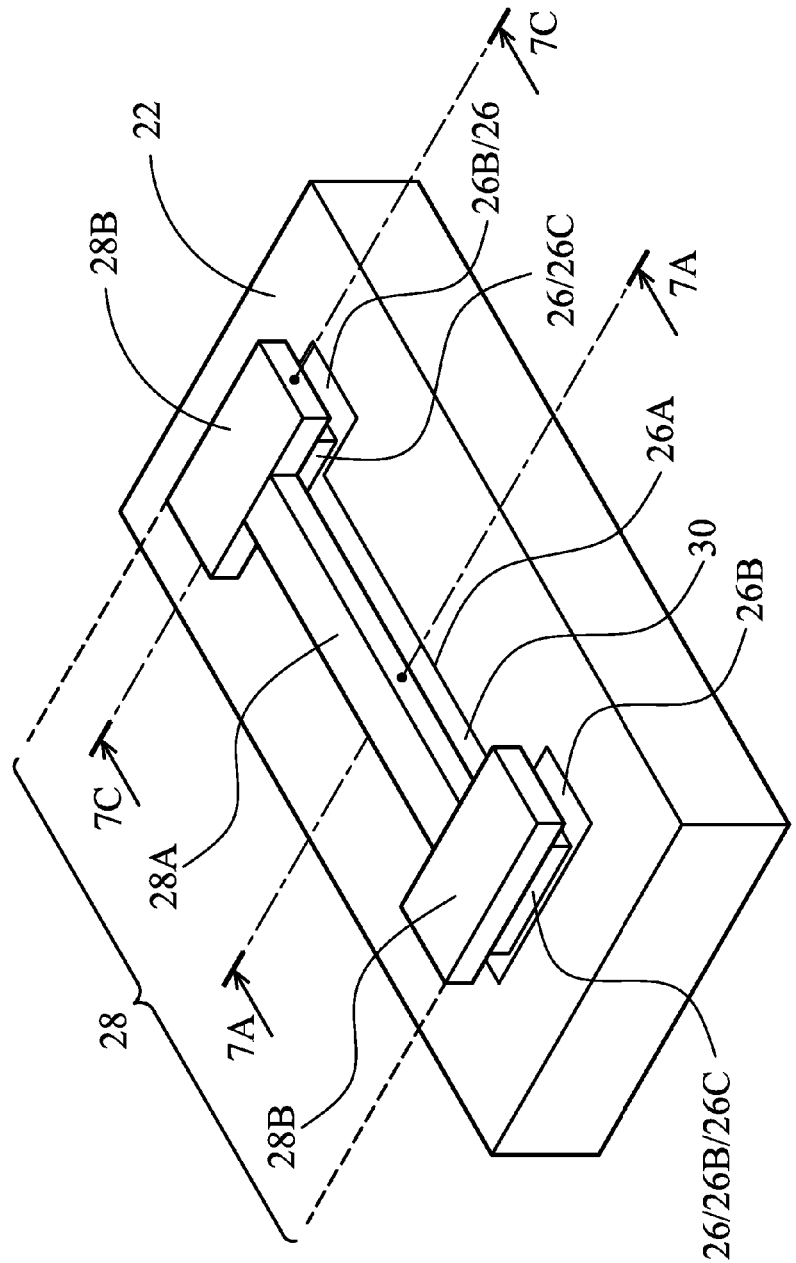
Figure 7C:
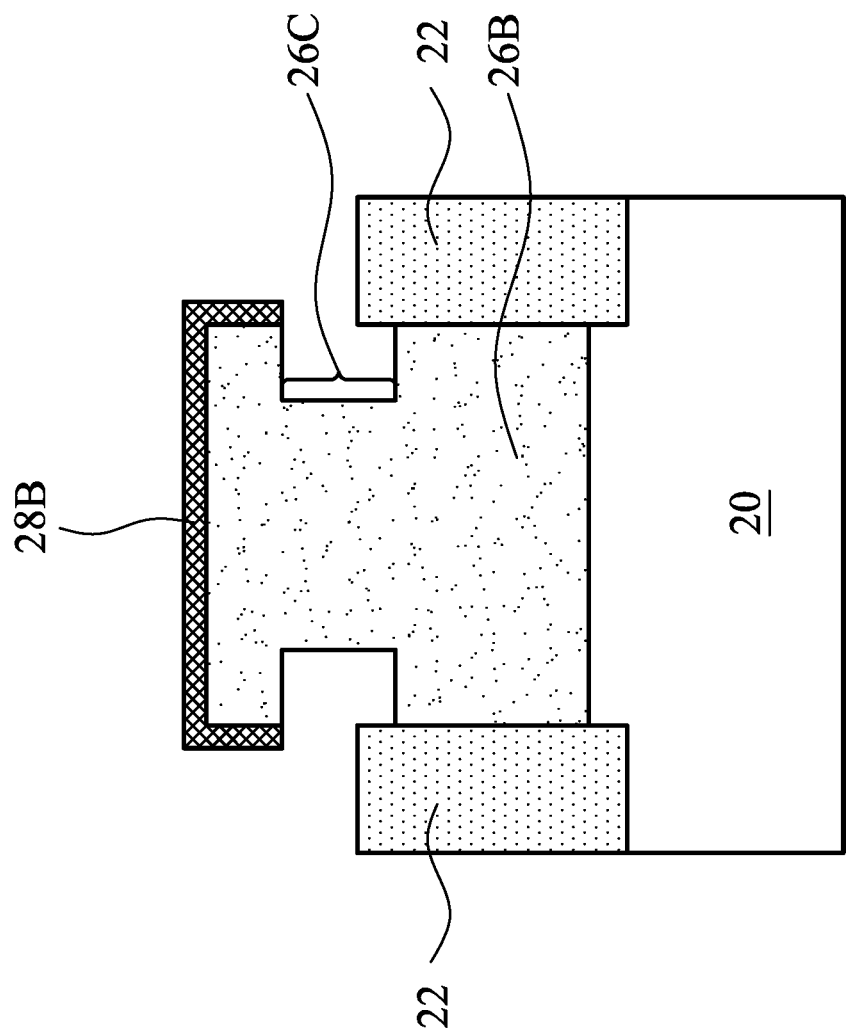

FIG. 7B illustrates a perspective view of the structure shown in FIG. 7A, wherein the cross-sectional view in FIG. 7A is obtained from the plane crossing line 7A-7A in FIG. 7B. It is observed that wide portions 26B of epitaxy region 26 are recessed from the sidewalls. However, center portion 26C of wide portions 26B remain not etched. FIG. 7C illustrates a cross-sectional view of one of the center portions 26C, wherein the cross-sectional view is obtained from the plane crossing line 7C-7C in FIG. 7B. Accordingly, epitaxy semiconductor layer 28 is supported by the center portion 26C of epitaxy region 26, although narrow portion 28A of epitaxy semiconductor layer 28 is fully suspended above air gap 30.

Figure 8A:
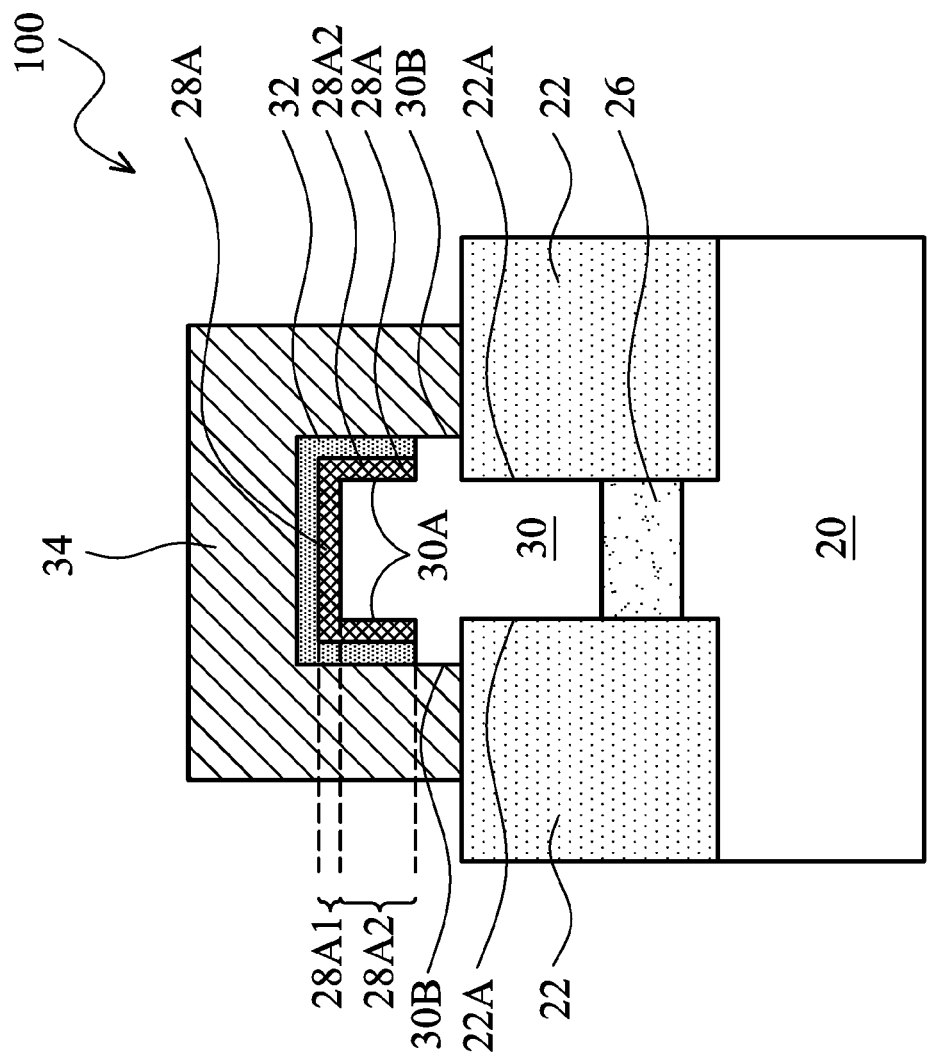
Figure 8B:
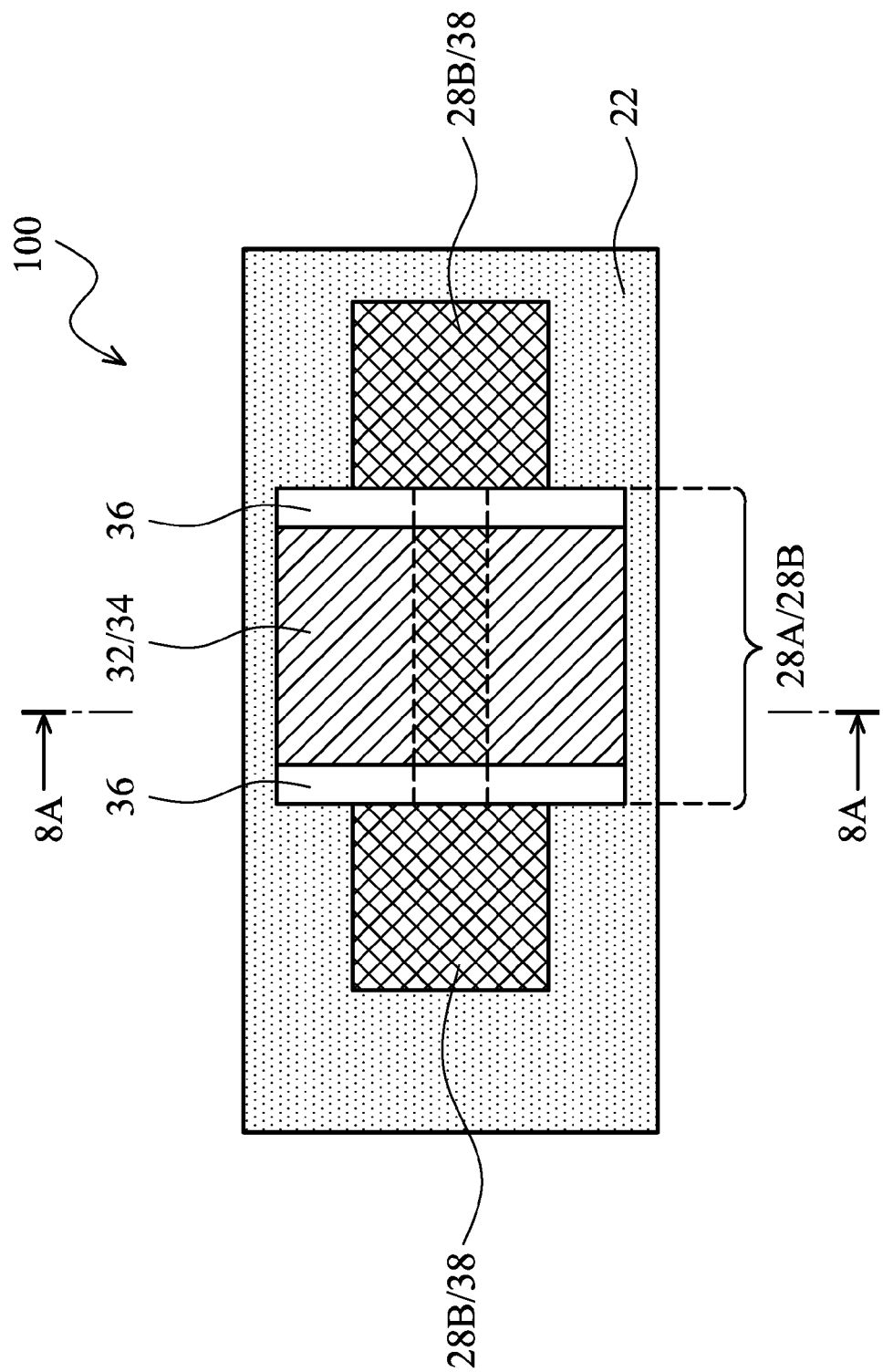
Figure 9:
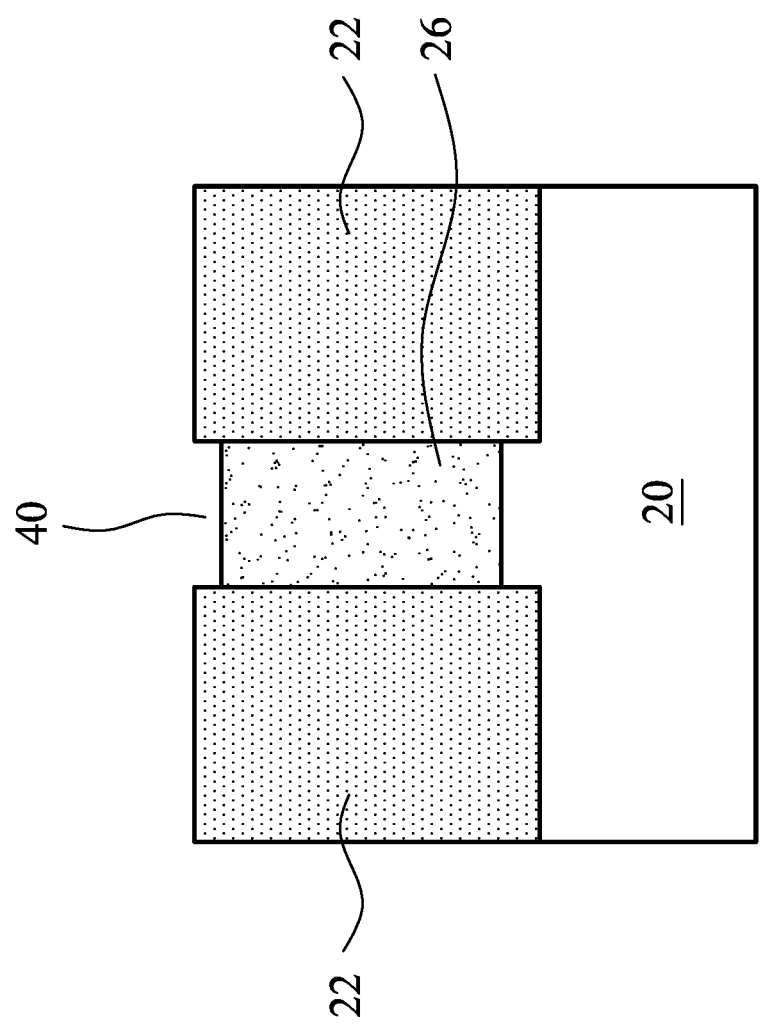
FIGS. 9 through 13 illustrate cross-sectional views, top views, and perspective views of intermediate stages in the manufacturing of a MOSFET in accordance with some alternative exemplary embodiments.

Next, as shown in FIGS. 8A and 8B, MOSFET 100 is formed, with narrow portion 28A of epitaxy semiconductor layer 28 forming the channel region of MOSFET 100. FIGS. 8A and 8B illustrate a cross-sectional view and a top view, respectively, with the cross-sectional view in FIG. 8A obtained from the plane crossing line 8A-8A in FIG. 8B. As shown in FIGS. 8A and 8B, MOSFET 100 includes gate dielectric 32, gate electrode 34, and gate spacers 36 on the sidewalls of gate electrode 34. Referring to FIG. 8B, gate dielectric 32 and gate electrode 34 may overlap narrow portions 28A, and may no overlap wide portions 28B (FIG. 8B), of epitaxy semiconductor layer 28. Referring to FIG. 8A, gate dielectric 32 is formed on the sidewalls and the top surface of channel region 28A. The material of gate dielectric 32 may include silicon oxide, silicon nitride, or high-k dielectric materials such as Hf-containing dielectrics or other kinds of high-k materials. Gate electrode 34 may be formed of polysilicon, metals, metal silicides, and/or the like.

Next, as also shown FIG. 8B, source and drain regions 38 are formed, wherein the formation process may include, for example, an implantation step, which is performed after the formation of gate spacers 36. In some embodiments, an additional epitaxy layer, which is also illustrated using reference numeral 38, may be grown on wide portions 28B of epitaxy semiconductor layer 28. The additional epitaxy layer also forms parts of the source and drain regions 38.

Referring to FIG. 8A again, narrow portion 28A of epitaxy semiconductor layer 28 forms the channel region of MOSFET 100. Since channel region 28A includes a top portion 28A1, and two edge portions 28A2 below and connected to the opposite sides of top portion 28A1, the respective MOSFET 100 is a Fin Field-Effect Transistor (FinFET).

FIGS. 9 through 13 illustrate cross-sectional views of intermediate stages in the formation of a MOSFET in accordance with alternative embodiments. Unless specified otherwise, the materials and the formation methods of the components in these embodiments are essentially the same as the like components, which are denoted by like reference numerals in the embodiments shown in FIGS. 1 through 8B. The details of the like components shown in FIGS. 9 through 13 may thus be found in the discussion of the embodiments shown in FIGS. 1 through 8B. The process is briefly discussed herein.

Figure 10:
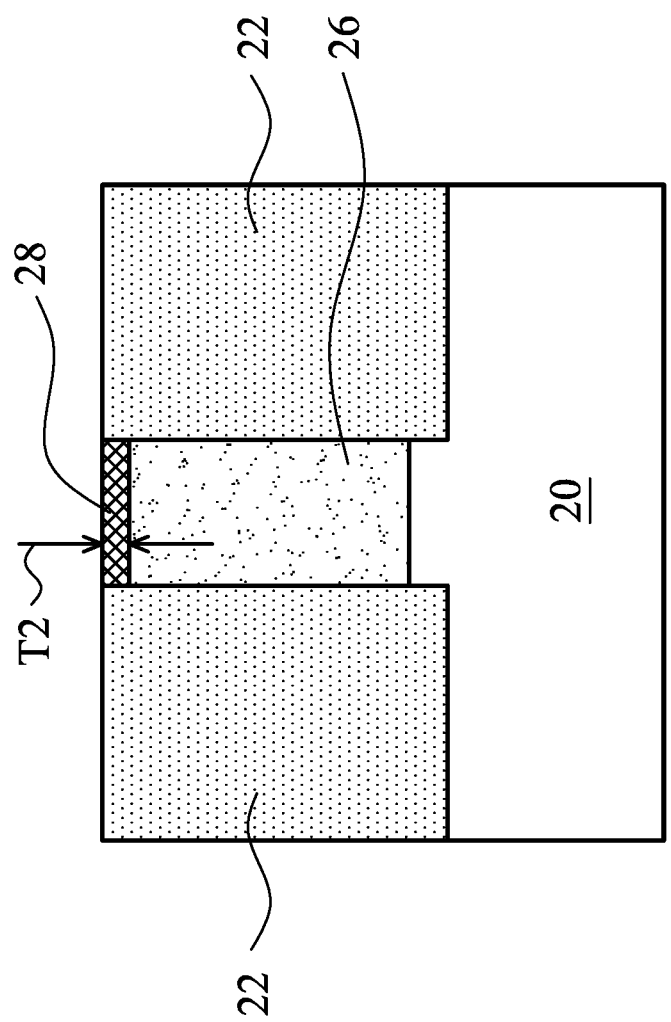

The initial steps of these embodiments are essentially the same as shown in FIG. 1. Next, referring to FIG. 9, epitaxy region 26 is formed. The top-view shape of epitaxy region 26 may be found in FIG. 11B. The top surface of epitaxy region 26 is level to the top surface of the STI regions 22, which are on the opposite sides of epitaxy region 26. The portion of substrate 20 between the opposite STI regions 22 is recessed slightly to form recess 40. Next, as shown in FIG. 10, epitaxy semiconductor layer 28 is formed in the recess through epitaxy. Thickness T2 of epitaxy semiconductor layer 28 may be between about 5 nm and about 40 nm, for example.

In alternative embodiments, the formation of epitaxy region 26 is skipped. Instead, a top portion of semiconductor substrate 20 between opposite sidewalls of STI regions 22 (please refer to FIG. 1) is recessed slightly to form recess 40 as in FIG. 9, and epitaxy semiconductor layer 28 is grown in recess 40 and from the exposed portion of substrate 20. The resulting structure is essentially the same as the structure shown in FIG. 10, except that epitaxy region 26 is instead a portion of original substrate 20.

Figure 11A:
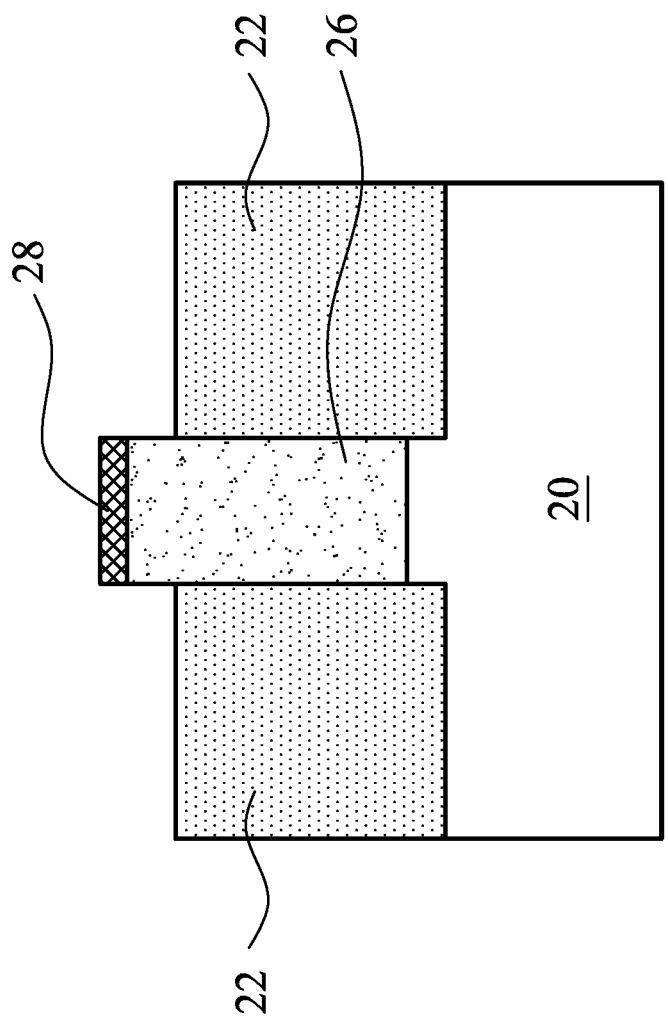
Figure 11B:
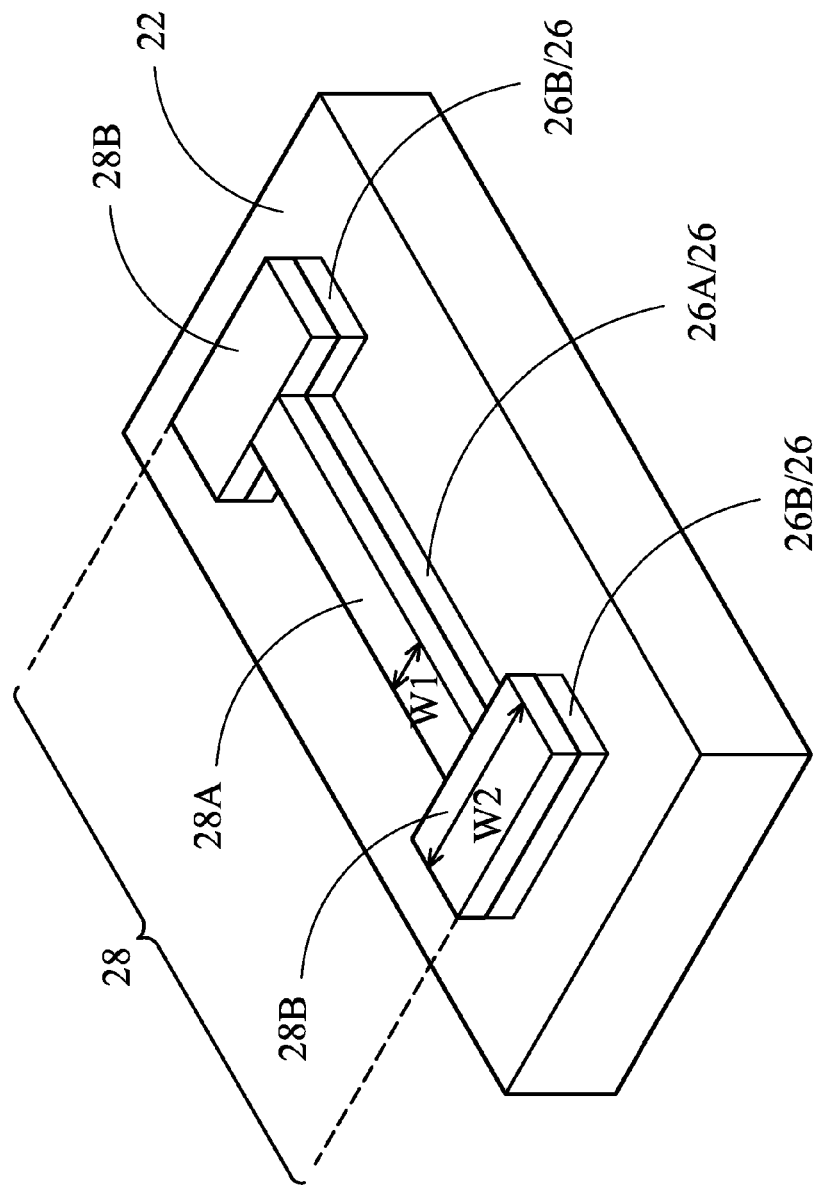

Next, as shown in FIGS. 11A and 11B, which are a cross-sectional view and a perspective view, respectively, STI regions 22 are recessed, so that epitaxy semiconductor layer 28 is higher than the resulting STI regions 22. The portions of the sidewalls of epitaxy region 26 are also exposed. As shown in FIG. 11B, epitaxy region 26 includes narrow portion 26A, and wide portions 26B connected to opposite ends of narrow portion 26A. Epitaxy semiconductor layer 28 may include narrow portion 28A, and wide portions 28B connected to the opposite ends of narrow portion 28A. Width W2 is greater than width W1.

Figure 12A:
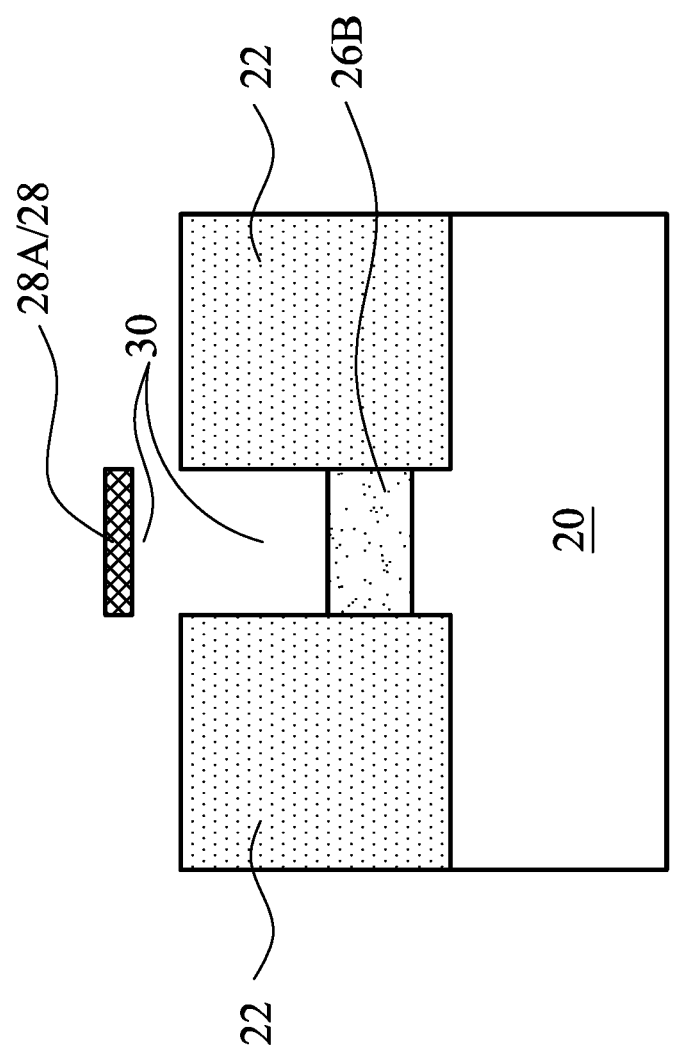
Figure 12B:
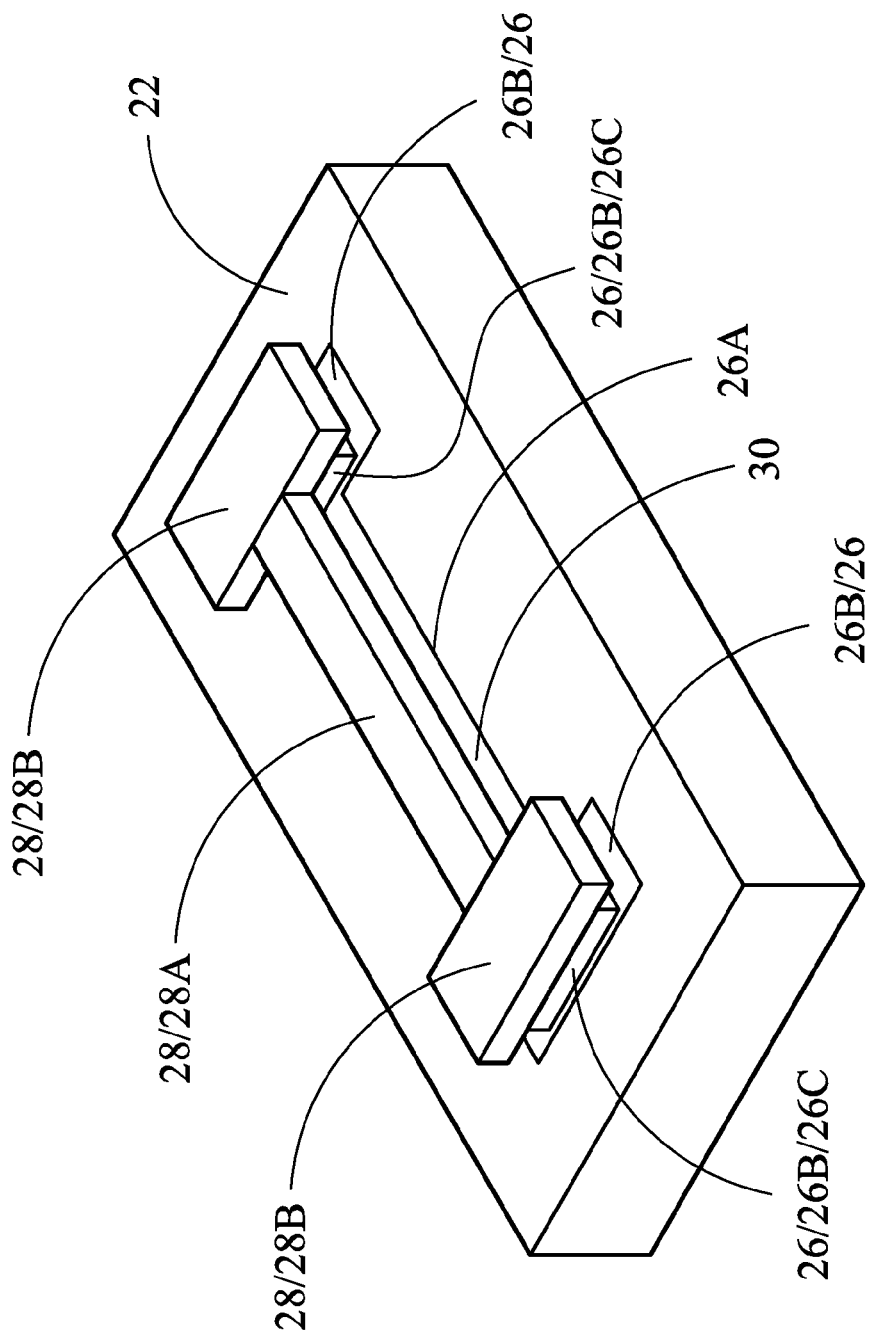

Next, as shown in FIGS. 12A and 12B, an etching is performed to remove the top portions of narrow portion 26A of epitaxy region 26. Accordingly, air gap 30 is formed under the narrow portion 28A of epitaxy semiconductor layer 28. As shown in FIG. 12B, wide portions 26B are recessed from their sidewalls, and center portions 26C of wide portions 26B are not etched. Accordingly, epitaxy semiconductor layer 28 is supported by center portions 26C, and the narrow portion 28A is suspended over air gap 30. The etchant for performing the etching is related to the materials of epitaxy semiconductor layer 28 and epitaxy region 26. Alternatively, if epitaxy semiconductor layer 28 is formed on substrate 20, with no epitaxy region 26 formed, the etchant is selected to attach epitaxy semiconductor layer 28 without attacking substrate 20. The exemplary materials and the respective etchants are discussed in the embodiments shown in FIGS. 1 through 8B.

Figure 13:
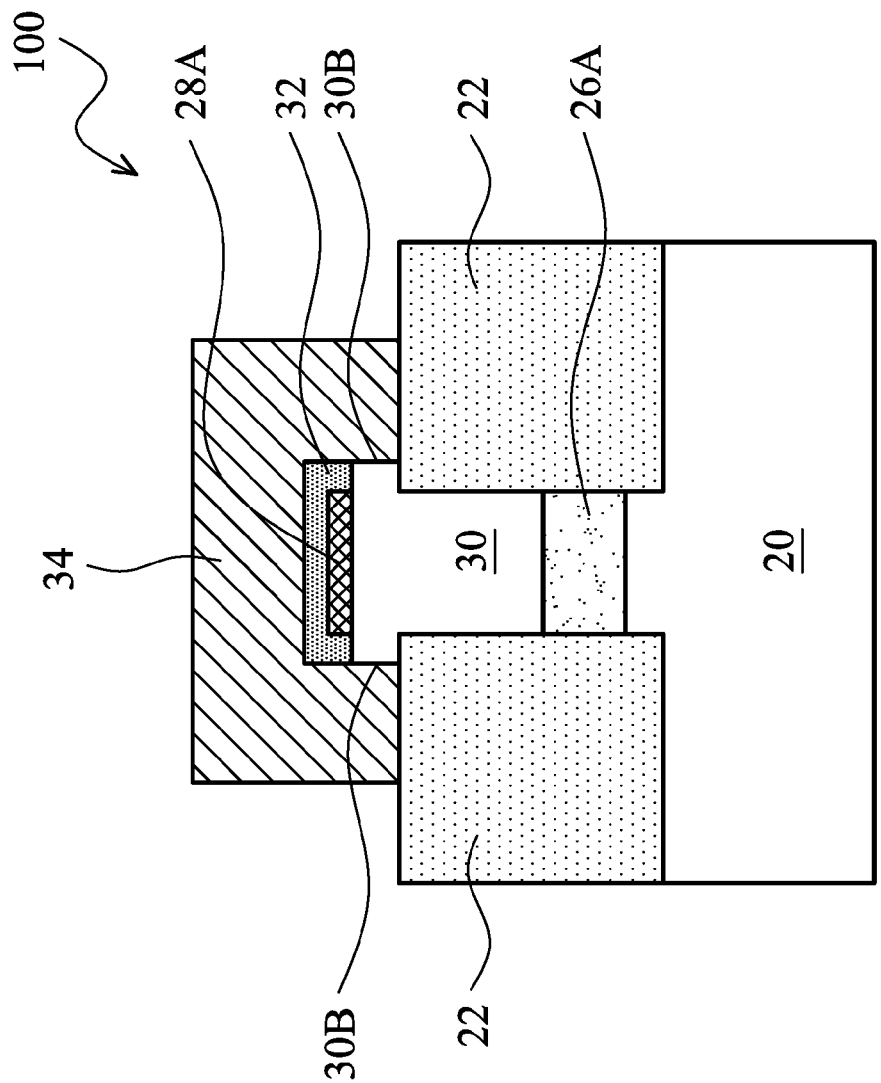

FIG. 13 illustrates the formation of MOSFET 100, which includes gate dielectric 32 and gate electrode 34. A top view of the MOSFET 100 in FIG. 13 is essentially the same as shown in FIG. 8B. Similarly, source and drain regions 38 and gate spacers 36 are also formed. As shown in FIG. 13, in these embodiments, channel region 28A is planar, and hence the respective MOSFET 100 is a planar MOSFET.

It is observed that in the MOSFET 100 as shown in FIGS. 8A, 8B, and 13, channel region 28A have bottom surfaces higher than the top surface of the adjacent STI regions 22. Furthermore, the top portions of air gaps 30 are higher than the top surfaces of STI regions 22. As a result, the respective gate electrodes 34 may have portions lower than the top surfaces of air gaps 30. In FIG. 8A, air gap 30 includes a portion extending between the opposite edge-portions 28A2, and edges 30A of air gap 30 are substantially aligned to the respective edges 22A of STI regions 22. Furthermore, in FIGS. 8A and 13, edges 30B of air gap 30 are over and aligned to STI regions 22, and have a greater space from each other than edges 30A. Air gap 30 insulates channel region 28A from substrate 20, and hence the leakage current of MOSFET 100 is reduced, and the short channel effect is improved. In the resulting MOSFET 100, air gap 30 may be filled with air, or may be vacuumed.

In accordance with embodiments, a device includes a semiconductor substrate, and a channel region of a transistor over the semiconductor substrate. The channel region includes a semiconductor material. An air gap is disposed under and aligned to the channel region, with a bottom surface of the channel region exposed to the air gap. Insulation regions are disposed on opposite sides of the air gap, wherein a bottom surface of the channel region is higher than top surfaces of the insulation regions. A gate dielectric of the transistor is disposed on a top surface and sidewalls of the channel region. A gate electrode of the transistor is over the gate dielectric.

In accordance with other embodiments, a device includes a semiconductor substrate, and insulation regions at a top portion of semiconductor substrate. The insulation regions have two sidewalls facing each other, wherein the opposite sidewalls are spaced apart from each other by a space. A channel region formed of a semiconductor material is disposed over the semiconductor substrate and aligned to the space. An air gap is disposed underlying and aligned to the channel region, wherein the air gap includes edges substantially aligned to respective ones of the two sidewalls of the insulation regions. A gate dielectric is on a top surface and sidewalls of the channel region. A gate electrode is over the gate dielectric. The channel region, the gate dielectric, and the gate electrode form parts of a transistor.

In accordance with yet other embodiments, a method includes performing an epitaxy to grow a semiconductor layer. The semiconductor layer has a top portion over a semiconductor region. The semiconductor region is between two insulation regions that are in a substrate. The insulation regions are recessed to expose portions of sidewalls of the semiconductor region. A portion of the semiconductor region is etched, wherein the etched portion of the semiconductor region is under and contacting a bottom surface of the semiconductor layer. The semiconductor layer is substantially not etched, and the semiconductor layer is spaced apart from an underlying region by an air gap. The method further includes forming a gate dielectric over the semiconductor layer, and forming a gate electrode over the gate dielectric.

In accordance with some embodiments of the present disclosure, a method includes performing an epitaxy to grow a semiconductor layer, which includes a top portion over a semiconductor region. The semiconductor region is between two insulation regions that are in a substrate. The method further includes recessing the insulation regions to expose portions of sidewalls of the semiconductor region, and etching a portion of the semiconductor region, wherein the etched portion of the semiconductor region is under and contacting a bottom surface of the semiconductor layer, wherein the semiconductor layer is spaced apart from an underlying region by an air gap. A gate dielectric and a gate electrode are formed over the semiconductor layer.

In accordance with alternative embodiments of the present disclosure, a method includes performing an epitaxy to grow an epitaxy semiconductor layer over a semiconductor region, wherein the semiconductor region includes a middle portion and end portions on opposite sides of the middle portion. The semiconductor region is etched to remove the middle portion of the semiconductor region to form a recess, wherein a center part of each of the end portions of the semiconductor region remains after the etching. A gate dielectric and a gate electrode are formed over the semiconductor layer.

In accordance with alternative embodiments of the present disclosure, a method includes performing a first recess to recess STI regions to have a first top surface, wherein a top portion of a semiconductor region in the STI regions is over the first top surface. An epitaxy semiconductor layer is formed on a top surface and sidewalls of the top portion of the semiconductor region. A second recess is performed to recess the STI regions to have a second top surface, wherein a bottom end of the epitaxy semiconductor layer is over, and is spaced apart from, the second top surface, with an intermediate portion of the semiconductor region exposed. An intermediate portion of the semiconductor region is etched to form an air gap, wherein the air gap is between the epitaxy semiconductor layer and a remaining bottom portion of the semiconductor region. The method further includes forming a gate dielectric over a middle portion of the epitaxy semiconductor layer, with the gate dielectric overlapping the air gap, and forming a gate electrode over the gate dielectric.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   recessing insulation regions on opposite sides of a semiconductor region to expose an intermediate portion of the semiconductor region, wherein a semiconductor layer is on a top surface and a sidewall of a top portion of the semiconductor region;
   etching the intermediate portion of the semiconductor region to form an air gap between the semiconductor layer and a bottom portion of the semiconductor region;
   forming a gate dielectric over the semiconductor layer; and
   forming a gate electrode over the gate dielectric.

2. The method of claim 1 further comprising:
   before the recessing, performing an additional recessing to recess the insulation regions, wherein after the additional recessing, the top portion of the semiconductor region protrudes above top surfaces of the insulation regions; and
   performing an epitaxy to grow the semiconductor layer on the top portion of the semiconductor region.

3. The method of claim 2 further comprising:
   before the epitaxy and the additional recessing, recessing a top portion of a substrate to form a recess; and
   epitaxially growing the semiconductor region in the recess.

4. The method of claim 2, wherein after the semiconductor region is etched to form the air gap, the air gap extends below top surfaces of the isolation regions.

5. The method of claim 1, wherein the semiconductor layer comprises:
   a narrow portion; and
   two wide portions wider than the narrow portion connected to opposite ends of the narrow portion, wherein during the etching the intermediate portion of the semiconductor region, the air gap is formed underlying the narrow portion of the semiconductor layer, and wherein the semiconductor layer is supported by remaining portions of the semiconductor region underlying and overlapping the two wide portions of the semiconductor layer.

6. The method of claim 1, wherein after the forming the gate electrode, the air gap remains.

7. The method of claim 1, wherein the gate dielectric and the gate electrode overlap the air gap.

8. A method comprising:
   forming a semiconductor layer over a semiconductor region;
   etching a middle portion and end portions of the semiconductor region, wherein an air gap is left by the etched middle portion, and a center part of each of the end portions of the semiconductor region remains after the etching;
   after the etching, forming a gate dielectric over the semiconductor layer; and
   forming a gate electrode over the gate dielectric.

9. The method of claim 8, wherein during the etching, the middle portion and the end portions of the semiconductor region are etched simultaneously.

10. The method of claim 8, wherein during the etching, the semiconductor layer is exposed to a same etchant as the semiconductor region, and is not etched.

11. The method of claim 8, wherein after the gate dielectric and the gate electrode are formed, the air gap remains underlying the gate dielectric and the gate electrode.

12. The method of claim 8, wherein the semiconductor region is formed in an insulation region, and the method further comprises recessing the insulation region, with a top portion of the semiconductor region being over a top surface of the insulation region.

13. The method of claim 12 further comprising an epitaxy for growing the semiconductor layer on a top surface, and not on sidewalls, of the semiconductor region.

14. The method of claim 12 further comprising an epitaxy for growing the semiconductor layer on a top surface and a sidewall of the semiconductor region.

15. A method comprising:
   performing a first recess to recess Shallow Trench Isolation (STI) regions to have a first top surface, wherein a top portion of a semiconductor region in the STI regions is over the first top surface;
   forming an epitaxy semiconductor layer starting from the top portion of the semiconductor region;
   performing a second recess to recess the STI regions to have a second top surface, wherein an intermediate portion of the semiconductor region is exposed, with the intermediate portion being underlying the top portion; and
   etching the intermediate portion of the semiconductor region to form an air gap, with the epitaxy semiconductor layer remaining over the air gap, and a center portion of end portions of the semiconductor region remaining after the etching.

16. The method of claim 15, wherein the semiconductor region comprises a middle portion and end portions on opposite sides of the middle portion, with the end portions wider than the middle portion, wherein in the etching, the middle portion of the semiconductor region over the first top surface of the STI regions is fully etched, and the end portions of the semiconductor region over the first top surface of the STI regions are partially etched.

17. The method of claim 15, wherein the epitaxy semiconductor layer and the semiconductor region comprise different semiconductor materials, and the etching is performed using an etchant that does not etch the epitaxy semiconductor layer substantially.

18. The method of claim 15, wherein the epitaxy semiconductor layer comprises silicon, and the semiconductor region comprises germanium, with a germanium percentage of the epitaxy semiconductor layer higher than a germanium percentage of the semiconductor region, and wherein the etching is performed using an etchant comprising hydrogen chloride (HCl).

19. The method of claim 15, wherein the epitaxy semiconductor layer and the semiconductor region comprise different III-V compound semiconductors, and wherein the etching is performed using an etchant comprising $H_2O_2$ and an acid comprising $H_3PO_4$ or citric acid.

20. The method of claim 15, wherein the epitaxy semiconductor layer and the semiconductor region comprise different III-V compound semiconductors, and wherein the etching is performed using an etchant comprising $NH_4OH$.

* * * * *